(12) United States Patent
Kandori et al.

(10) Patent No.: US 7,193,413 B2
(45) Date of Patent: Mar. 20, 2007

(54) MAGNETIC FIELD MEASUREMENT APPARATUS

(75) Inventors: Akihiko Kandori, Kokubunji (JP); Keiji Tsukada, Okayama (JP); Daisuke Suzuki, Kodaira (JP)

(73) Assignee: Hitachi High-Technologies Corp., Tokyo (JP)

( * ) Notice: Subject to any disclaimer, the term of this patent is extended or adjusted under 35 U.S.C. 154(b) by 222 days.

(21) Appl. No.: 10/855,374

(22) Filed: May 28, 2004

(65) Prior Publication Data

US 2004/0263162 A1 Dec. 30, 2004

(30) Foreign Application Priority Data

Jun. 23, 2003 (JP) .............................. 2003-177826

(51) Int. Cl.
G01R 33/025 (2006.01)
G01R 33/035 (2006.01)

(52) U.S. Cl. ...................... 324/244; 324/248

(58) Field of Classification Search ................ 324/244, 324/248, 249; 600/409; 326/5; 505/162
See application file for complete search history.

(56) References Cited

U.S. PATENT DOCUMENTS

| | | | | |
|---|---|---|---|---|
| 4,823,081 A | * | 4/1989 | Geisler | 324/225 |
| 5,027,069 A | * | 6/1991 | Roehrlein | 324/248 |
| 5,113,136 A | * | 5/1992 | Hayashi et al. | 324/247 |
| 5,122,744 A | * | 6/1992 | Koch | 324/248 |
| 5,283,522 A | * | 2/1994 | Corby, Jr. | 324/244 |
| 5,642,045 A | * | 6/1997 | Keefe et al. | 324/244 |
| 6,339,328 B1 | * | 1/2002 | Keene et al. | 324/248 |
| 6,462,540 B1 | * | 10/2002 | Kandori et al. | 324/248 |
| 2003/0016010 A1 | * | 1/2003 | Kandori et al. | 324/248 |
| 2005/0088174 A1 | * | 4/2005 | Lee et al. | 324/248 |

FOREIGN PATENT DOCUMENTS

| | | | |
|---|---|---|---|
| JP | 411330768 A | * | 11/1999 |
| JP | 2001104264 | * | 4/2001 |

OTHER PUBLICATIONS

W.A.M. Aamink et al., Active Compensation for Multichannel Magnetocardiography in an Unshielded Environment, IEEE Transactions on Applied Superconductivity, vol. 5, No. 2, (Jun. 1995), pp. 2470-2473.*
JP2001104264 and machine translation thereof, Kandori et al., publication date Apr. 17, 2001.*
Meas. Sci. Technol., 1991, vol. 2, H J M ter Brake et al, pp. 596-601.
Clin. Phys. Physiol. Meas., 1991, vol. 12, Suppl. B., J. Vrba et al., pp. 81-86.

* cited by examiner

Primary Examiner—Edward Lefkowitz
Assistant Examiner—Kenneth J. Whittington
(74) Attorney, Agent, or Firm—Mattingly, Stanger, Malur & Brundidge, P.C.

(57) ABSTRACT

A magnetic field measurement apparatus which reduces an interference magnetic field entering into a pick-up coil is provided. The magnetic field measurement apparatus includes a superconducting quantum interference device (SQUID) magnetometer having a pick-up coil for picking up a magnetic field generated from an examination object, a SQUID control unit for controlling the SQUID magnetometer, a magnetometer for picking up the interference magnetic field, a magnetometer control unit for controlling the magnetometer, a modulation circuit, a current converter, a current amount adjusting device, a coil which is positioned outside the pick-up coil and through which the current thus adjusted by the current amount adjusting device flows, a demodulation circuit, a low-pass filter (LPF) for extracting a low frequency element of the output voltage from the demodulation circuit, and a subtraction circuit for subtracting the output of the LPF from the output of the SQUID control unit.

19 Claims, 9 Drawing Sheets

MAGNETIC FIELD MEASUREMENT APPARATUS

CLAIM OF PRIORITY

The present invention claims priority from Japanese application JP 2003-177826 filed on Jun. 23, 2003, the content of which is hereby incorporated by reference on to this application.

BACKGROUND OF THE INVENTION

The present invention relates to a magnetic field measurement technique employing a SQUID (Superconducting Quantum Interference Device) magnetometer, which is a superconducting device. More particularly, it relates to a technique for reducing an interference magnetic field in the magnetic field measurement apparatus.

In the measurement by the magnetic field measurement apparatus employing the SQUID, a measurement such as extremely feeble magnetoencephalogram and magnetocardiogram is performed in the interior of a magnetically shielded room having an extinction ratio of 40 to 50 dB or more. In many cases, a pick-up coil for picking up a biomagnetic field has a form of first-order gradiometer, which picks up a difference between a one-turn pick-up coil and a coil inversely wound. The first-order gradiometer features that it cancels the interference magnetic field generated from a magnetic field source located faraway, and it is capable of picking up a signal as to the magnetic field generated from the vicinity such as the heart and the brain without canceling in large scale. Therefore, an impact from the interference magnetic field can be easily reduced. Usually, the first-order gradiometer brings an attenuation of approximately 40 to 50 dB with respect to a uniform field.

As thus described, it is possible to cancel the interference magnetic field at least approximately 80 to 100 dB by combining the magnetically shielded room and the first-order gradiometer. However, in the case where an object generating a large magnetic field, such as a train and a car, passes nearby at a distance of around 50 m to 100 m from the magnetically shielded room, there is observed an interference magnetic field larger than the magnetic field generated from a living body by a factor of 10 times. In order to cancel such intense interference magnetic field, various methods have been attempted so far.

For example, as shown in FIG. 9, there has been proposed a method where a magnetic field signal is used, which is picked up from a magnetometer sensor unit 15 of a fluxgate that is positioned outside the magnetically shielded room 16, allowing a feedback current to flow into a solenoid coil 8 wound on the magnetically shielded room externally, thereby conducting an adjustment so that an output from the fluxgate becomes zero (For example, see H J M ter Brake et al.: "Improvement of the performance of a i-metal magnetically shielded room by means of active compensation", Meas. Sci. Technol. (1991), Vol.2, p.596–601). The solenoid coil 8 is arranged in such a manner as going along the exterior side surface of the magnetically shielded room 16.

The solenoid coil 8 is connected to a magnetometer control unit 14, which converts a magnetic field signal obtained from the magnetometer sensor unit 15 to a voltage, a PID control circuit 21, and a current converter 10. The magnetometer control unit 14 converts the interference magnetic field picked up by the magnetometer sensor unit 15 to a voltage, the PID control circuit 21 adjusts the current converted by the current converter 10, and allows thus adjusted current to flow into the solenoid coil 8. The adjustment of the current amount by the PID control circuit 21 is carried out so that the output from the magnetometer control unit 14 is minimized, or the output of the interference magnetic field from the magnetometer control unit 14 is minimized.

Since there is a shielding factor distortion spatially in the magnetically shielded room 16, it has been considered that the interference magnetic field picked up outside the magnetically shielded room 16 can be canceled with the highest degree of accuracy by using a canceling magnetic field, which is generated by the solenoid coil 8 positioned outside the magnetically shielded room 16.

In addition, there has been proposed a softwarily canceling method by use of a signal from a reference coil employing a SQUID sensor (for example, see J Vrba et al.: "Biomagnetometer for unshielded and well shielded Environments", Clin. Phys. Physiol. Meas. (1991) Vol.12 Suppl. B, p.81–86). However, details of the reference coil have not been described.

With the conventional method by use of the solenoid coil as described above, a canceling coil positioned outside the magnetically shielded room generates a uniform field within the magnetically shielded room. Therefore, in a multi-channel system including a plurality of first-order gradiometers, it is hard to correct variations in canceling rates with respect to each of the first-order gradiometers in respective channels.

In the softwarily canceling method as described above, there is no disclosure as to a configuration of the reference coil. Further, the cancel data being described is limited to those obtained without using the magnetically shielded room, and thus there is no discussion about a problem of distortion due to the magnetically shielded room.

SUMMARY OF THE INVENTION

In view of the problems as described above, an object of the present invention is to provide a magnetic field measurement technique for accurately reducing an interference magnetic field which enters into a pick-up coil.

In order to achieve the above object, the magnetic field measurement apparatus of the present invention includes a first magnetometer having a pick-up coil for picking up a magnetic field generated from a living body within a magnetically shielded room, a second magnetometer for picking up an interference magnetic field, a modulation circuit for modulating an output from the second magnetometer with a predetermined frequency, a transfer coil which converts the output from the modulation circuit to a current and transfers the current as a magnetic field to the pick-up coil of the first magnetometer, a demodulation circuit which allows the current corresponding to the output from the modulation circuit to flow into the transfer coil, and demodulates the output from the first magnetometer with the aforementioned predetermined frequency, a low-pass filter into which an output from the demodulation circuit is inputted, and a means for subtracting an output from the low-pass filter from the output of the first magnetometer. If the first magnetometer is a SQUID magnetometer, for example, the magnetic field measurement apparatus of the present invention further includes a cryostat for accommodating the SQUID magnetometer and a gantry for holding the cryostat.

According to the structure of the present invention, it is possible to accurately reduce the interference magnetic field, even in the case where the magnetically shielded room is not used or in the case where magnetic shielding by the magnetically shielded room is not sufficient. Further according to the present invention, by setting a carrier frequency of the modulation circuit at a frequency higher than the frequency band of a signal from the living body, it is possible for the demodulation circuit to accurately pick up only the interference magnetic field, thereby achieving a canceling of the interference magnetic field with a high degree of accuracy.

Hereafter, a representative structural example of the present invention will be described.

(1) The magnetic field measurement apparatus of the present invention is characterized in that it includes a first magnetometer having a pick-up coil for picking up a magnetic field generated from an examination object, a first control unit for controlling the first magnetometer, a second magnetometer for picking up the interference magnetic field, a second control unit for controlling the second magnetometer, a modulation circuit for modulating an output from the second control unit, a current converter for converting the output from the modulation circuit to a current amount, a current amount adjusting means for adjusting the current amount thus converted, a coil which is positioned outside the pick-up coil of the first magnetometer and through which the current thus adjusted by the current amount adjusting means flows, a demodulation circuit which demodulates the output from the first control unit with the same frequency as that of the modulation circuit, a low-pass filter for extracting a low frequency element of the output voltage from the demodulation circuit, and a subtraction circuit for subtracting the output of the low-pass filter from the output of the first control unit.

(2) The magnetic field measurement apparatus of the present invention is characterized in that it includes a SQUID magnetometer having a pick-up coil for picking up a magnetic field generated from an examination object, a cryostat for cooling the SQUID magnetometer, a first control unit for controlling the SQUID magnetometer, a magnetometer for picking up an interference magnetic field, a second control unit for controlling the magnetometer, a modulation circuit for modulating an output from the second control unit, a current converter for converting the output from the modulation circuit to a current amount, a current amount adjusting means for adjusting the current amount thus converted, a coil which is positioned outside the cryostat and arranged in such a manner as surrounding the pick-up coil of the SQUID magnetometer, and through which the current thus adjusted by the current amount adjusting means flows, a demodulation circuit which demodulates the output from the first control unit with the same frequency as that of the modulation circuit, a low-pass filter for extracting a low frequency element of the output voltage from the demodulation circuit, and a subtraction circuit for subtracting the output of the low-pass filter from the output of the first control unit.

(3) The magnetic field measurement apparatus of the present invention according to the aforementioned structure of (1) or (2), further includes a magnetically shielded room which surrounds the first magnetometer or the SQUID magnetometer, and the examination object, so as to carry out a magnetic shielding, wherein the coil through which the current adjusted by the current amount adjusting means flows is positioned outside the magnetically shielded room.

(4) The magnetic field measurement apparatus of the present invention is characterized in that it includes a first magnetometer having a pick-up coil for picking up a magnetic field generated from an examination object, a first control unit for controlling the first magnetometer, a second magnetometer for picking up the interference magnetic field, a second control unit for controlling the second magnetometer, a modulation circuit for modulating an output from the second control unit, an addition circuit for adding an output from the second control unit to an output from the modulation circuit, a current converter for converting an output from the addition circuit to a current amount, a current amount adjusting means for adjusting the current amount thus converted, a coil which is positioned outside the pick-up coil of the first magnetometer and through which the current thus adjusted by the current amount adjusting means flows, a demodulation circuit which demodulates the output from the first control unit with the same-frequency as that of the modulation circuit, a low-pass filter for extracting a low frequency element of the output voltage from the demodulation circuit, and a subtraction circuit for subtracting the output of the low-pass filter from the output of the first control unit.

(5) The magnetic field measurement apparatus of the present invention is characterized in that it includes a SQUID magnetometer having a pick-up coil for picking up a magnetic field generated from an examination object, a cryostat for cooling the SQUID magnetometer, a first control unit for controlling the SQUID magnetometer, a magnetometer for picking up an interference magnetic field, a second control unit for controlling the magnetometer, a modulation circuit for modulating an output from the second control unit, an addition circuit for adding an output from the second control unit to an output from the modulation circuit, a current converter for converting an output from the addition circuit to a current amount, a current amount adjusting means for adjusting the current amount thus converted, a coil which is positioned outside the cryostat and arranged in such a manner as surrounding the pick-up coil of the SQUID magnetometer and through which the current thus adjusted by the current amount adjusting means flows, a demodulation circuit which demodulates the output from the first control unit with the same frequency as that of the modulation circuit, a low-pass filter for extracting a low frequency element of the output voltage from the demodulation circuit, and a subtraction circuit for subtracting the output of the low-pass filter from the output of the first control unit.

(6) The magnetic field measurement apparatus of the present invention according to the aforementioned structure of (4) or (5), further includes a magnetically shielded room which surrounds the first magnetometer or the SQUID magnetometer, and the examination object, so as to carry out a magnetic shielding, wherein the coil through which the current adjusted by the current amount adjusting means flows is positioned outside the magnetically shielded room.

(7) The magnetic field measurement apparatus of the present invention according to the aforementioned structure of (4) or (5), further includes a feedback coil through which the current adjusted by the current amount adjusting means flows, the feedback coil being positioned outside the second magnetometer or the magnetometer.

(8) The magnetic field measurement apparatus of the present invention according to the aforementioned structure of (4) or (5), a pick-up section of the second magnetometer or the magnetometer is positioned inside the coil through which the current adjusted by the current amount adjusting means flows.

DETAILED DESCRIPTION OF THE PREFERRED EMBODIMENTS

Hereinafter, the preferred embodiments of the present invention will be explained with reference to the attached drawings.

Figure 7:
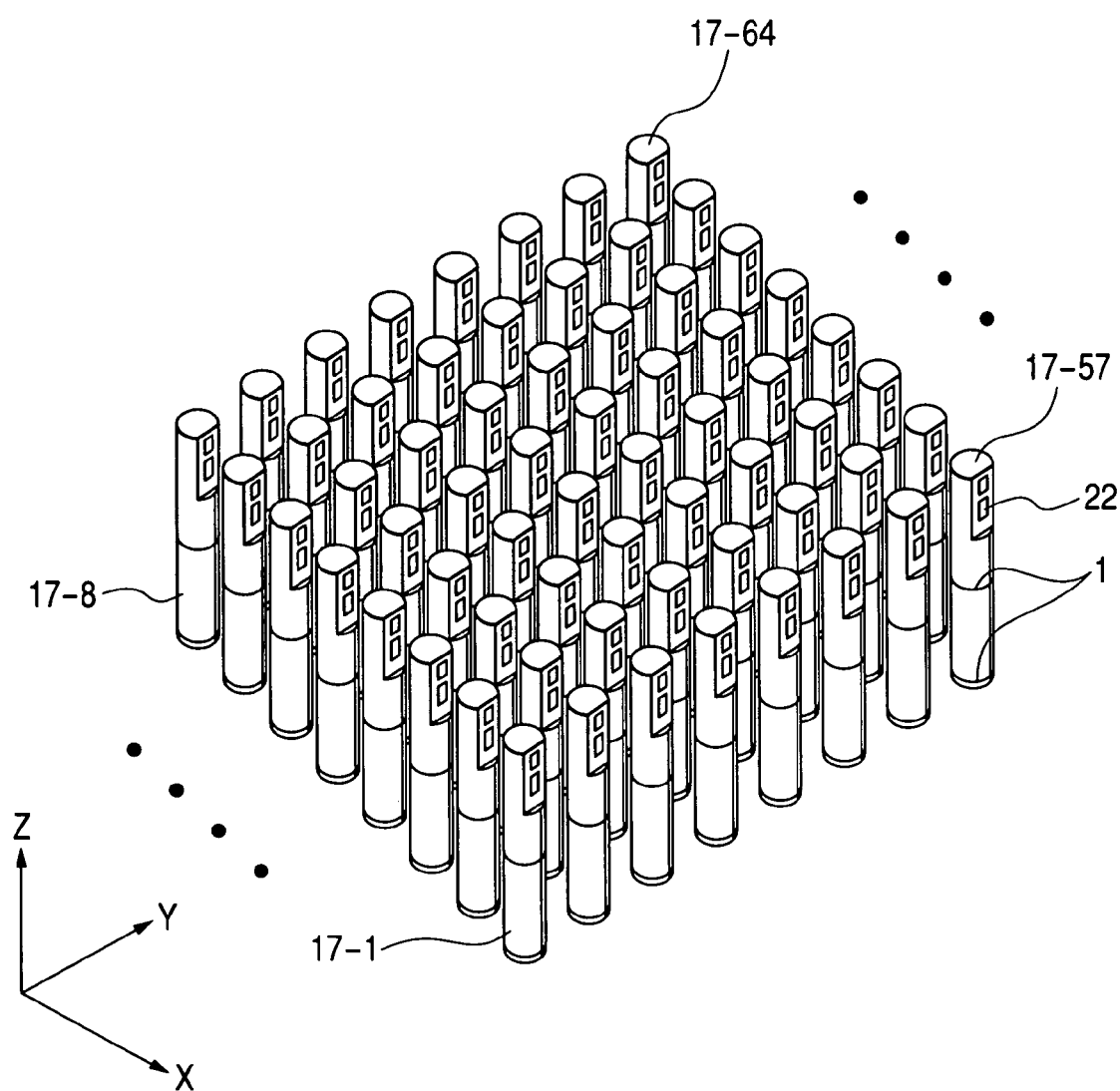
FIG. 7 is a view showing a form of array of the first-order gradiometers, which are used in each embodiment of the present invention.
Figure 8:
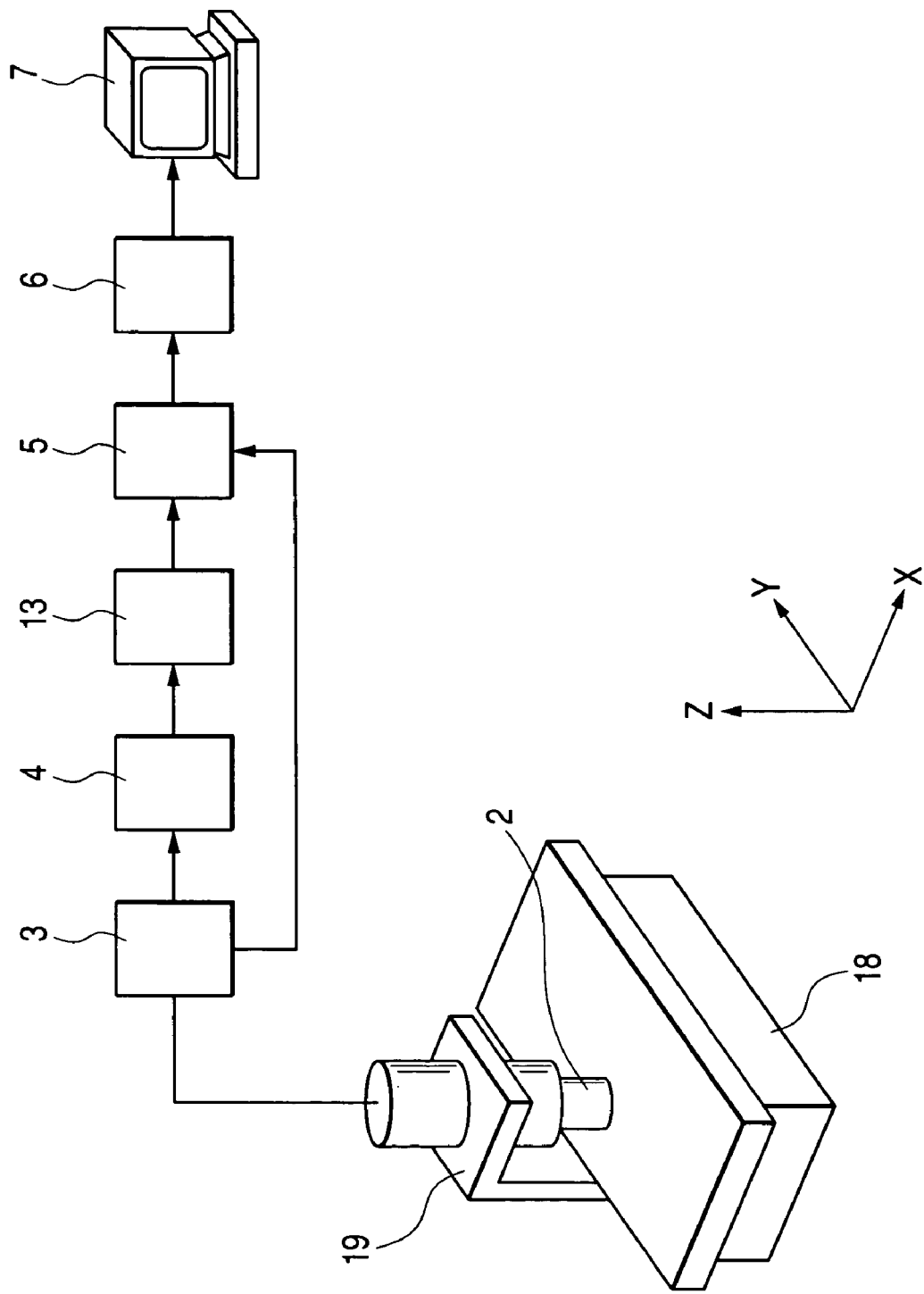
FIG. 8 is a diagram showing an arrangement of each unit of the magnetic field measurement apparatus in each embodiment of the present invention.

FIGS. 1 to 6 are diagrams respectively showing structural examples of the magnetic field measurement apparatus according to the first to the sixth embodiments of the present invention. FIG. 7 is a view showing a form of array of the first-order gradiometers, which are used in each embodiment of the present invention. FIG. 8 is a diagram showing an arrangement of each unit of the magnetic field measurement apparatus in each embodiment of the present invention. Explanations common to multiple embodiments will be made in the following.

Firstly, a structure of the magnetic field measurement apparatus common to the first embodiment (FIG. 1) to the sixth embodiment (FIG. 6) will be explained.

As shown in FIG. 1 to FIG. 6, a pick-up coil 1 made of superconductive material is positioned inside the cryostat 2. A refrigerant such as liquid helium and liquid nitrogen is stocked inside the cryostat 2, offering a structure such that the pick-up coil 1 and the SQUID arranged in the vicinity of the pick-up coil 1 are kept in a superconductive status.

For example, as shown in FIG. 7, the pick-up coil 1 is configured integrally with the SQUID 22, and first-order gradiometers 17-1 to 17-64 are arranged in a form of array 8×8. This arrangement is not limited to the array form, but the gradiometers may be arranged concentrically or may be freely arranged three-dimensionally. Alternatively, a second-order gradiometer may be used in a magnetically adverse environment, for example, where a magnetically shielded room is not employed.

As shown in FIG. 8, the cryostat 2 is fixedly attached to a cryostat gantry 19, and the examination object S is placed on an examination object supporting stage 18. In order to operate the SQUID magnetometer as a magnetometer, the SQUID control unit 3, the demodulation circuit 4, the subtraction circuit 5, the low-pass filter (LPF) 13, and the amplifier and filter circuit 6 are positioned outside the cryostat 2.

Figure 6:
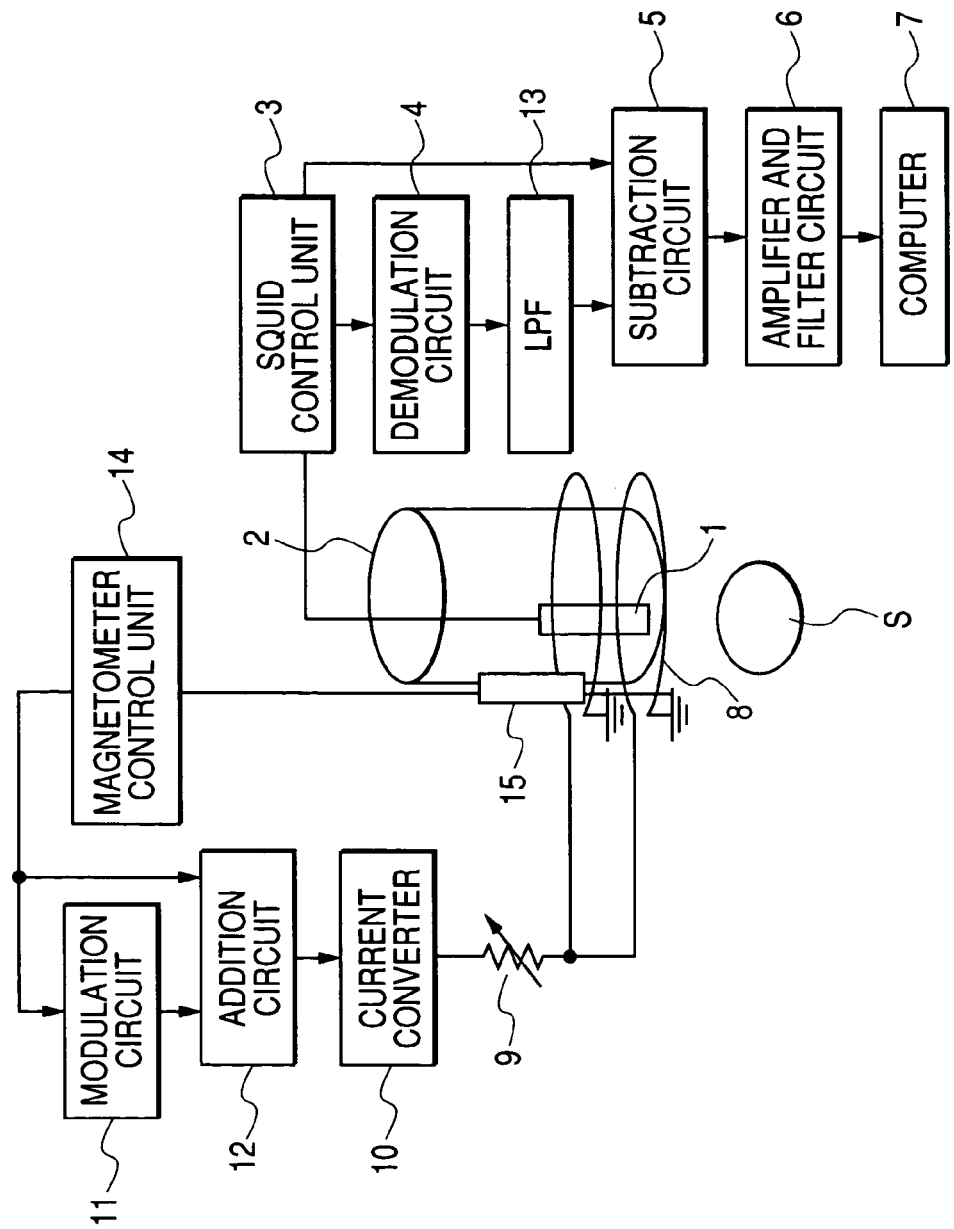
FIG. 6 is a diagram showing a structural example of the magnetic field measurement apparatus according to the sixth embodiment of the present invention.

Next, a processing of the outputs from the second magnetometer will be explained, which is common from the first embodiment (FIG. 1) to the sixth embodiment (FIG. 6).

The magnetometer sensor unit 15 as the second magnetometer is allowed to operate as the magnetometer by the magnetometer control unit 14. The magnetometer comprises devices such as a fluxgate type magnetometer, magnetic resistance device (MR) and the like. The magnetic field picked up by the magnetometer sensor unit 15 is converted to a voltage by the magnetometer control unit 14, and modulated with a carrier wave of a high frequency signal by the modulation circuit 11. With this modulation, low frequency signal elements disappear from the output signal of the modulation circuit 11, and the output signals of the modulation circuit 11 are converted into signals in frequency band of the sideband of the carrier wave frequency, all signals being high frequency. Here, the carrier wave frequency is set to a frequency higher than the frequency band included in the magnetic field signal generated from the examination object S.

Next, a signal processing of the output signal from the pick-up coil will be explained, which is common from the first embodiment (FIG. 1) to the sixth embodiment (FIG. 6).

Usually, the SQUID control unit 3 utilizes a FLL (Flux Locked Loop) circuit having a feedback circuit. Outputs from the SQUID control unit 3 are divided into paths of two channels. The first path is a route which passes through the demodulation circuit 4, and further passes the low-pass filter (LPF) 13. The second path is a route which directly uses the output from the SQUID control unit 3.

The outputs from the first and the second paths are inputted into the subtraction circuit 5. After the output voltage from the first path is adjusted to an optimal voltage, thus optimally adjusted voltage is subtracted from the output voltage of the second path by the subtraction circuit 5. With the amplifier and filter circuit 6, it is possible to obtain an output signal in a desired frequency band from the output of the subtraction circuit 5. An output from the amplifier and filter circuit 6 is reserved as digital data by a computer 7 having an A/D converter, and the computer 7 carries out processing such as signal display and signal analysis.

Next, a processing of the output signal from the modulation circuit 11, which is common to the first embodiment (FIG. 1) and the second embodiment (FIG. 2), and a signal processing of the output signal from the pick-up coil will be explained.

The output signal from the modulation circuit 11 is converted to a current amount by the current converter 10, and the current amount flowing into the solenoid coil 8 is adjusted by a variable resistor (current amount adjustment means) 9. It is desirable to set the current amount value so that the SQUID magnetometer can operate stably, and the output from the demodulation circuit 4 is a signal having sufficiently low noise level. The solenoid coil 8 is set so that it applies a uniform field to the pick-up coil 1. Ideally, it is desirable that the magnetic field direction generated in the solenoid coil 8 is consistent with the magnetic field direction picked up by the pick-up coil 1.

The magnetic field generated by the solenoid coil 8 is inputted into the pick-up coil 1, and it is converted into a voltage by the SQUID control unit 3. Then, the demodulation circuit 4 performs a demodulation with the frequency which agrees with the carrier wave frequency used in the modulation circuit 11. Since the output of the demodulation circuit 4 includes many high frequency signals close to the carrier wave frequency, the low-pass filter (LPF) 13 is used to obtain a signal including only low frequency elements.

The processing subsequent to the subtraction circuit 5 after outputting from the low-pass filter (LPF) 13 is same as that of aforementioned explanation.

Next, an addition circuit 12 will be explained, which is common from the third embodiment (FIG. 3) to the sixth embodiment (FIG. 6).

The addition circuit 12 adds the signal of the magnetic field picked up by the magnetometer sensor unit 15 to the modulation signal which has been obtained by modulating the carrier wave of high frequency signal in the modulation circuit 11, whereby a mixed signal is obtained. This mixed signal is converted to a current by the current converter 10 having a same structure as that shown in the first embodiment and the second embodiment. Then, the current amount is adjusted by the variable resistor (current amount adjusting means) 9 and it flows into the solenoid coil 8 as a current. The variable resistor 9 adjusts the current amount so that the magnetic field generated by the current which flows into the solenoid coil 8 minimizes the amount of the interference magnetic field which enters the pick-up coil 1.

Next, a structure common in the fifth embodiment (FIG. 5) and the sixth embodiment (FIG. 6) will be explained, where the magnetic field itself, picked up by the magnetometer sensor unit 15, is also given feedback.

In the structures of the fifth embodiment and the sixth embodiment, the magnetic field itself picked up by the magnetometer sensor unit 15 is given feedback, so that the magnetic field picked up by the magnetometer sensor unit 15 is minimized. According to the structures in the fifth embodiment and the sixth embodiment, the magnetometer sensor unit 15 can operate stably without reaching voltage saturation, thereby allowing the SQUID magnetometer to operate stably all the time.

EXAMPLE 1

Figure 1:
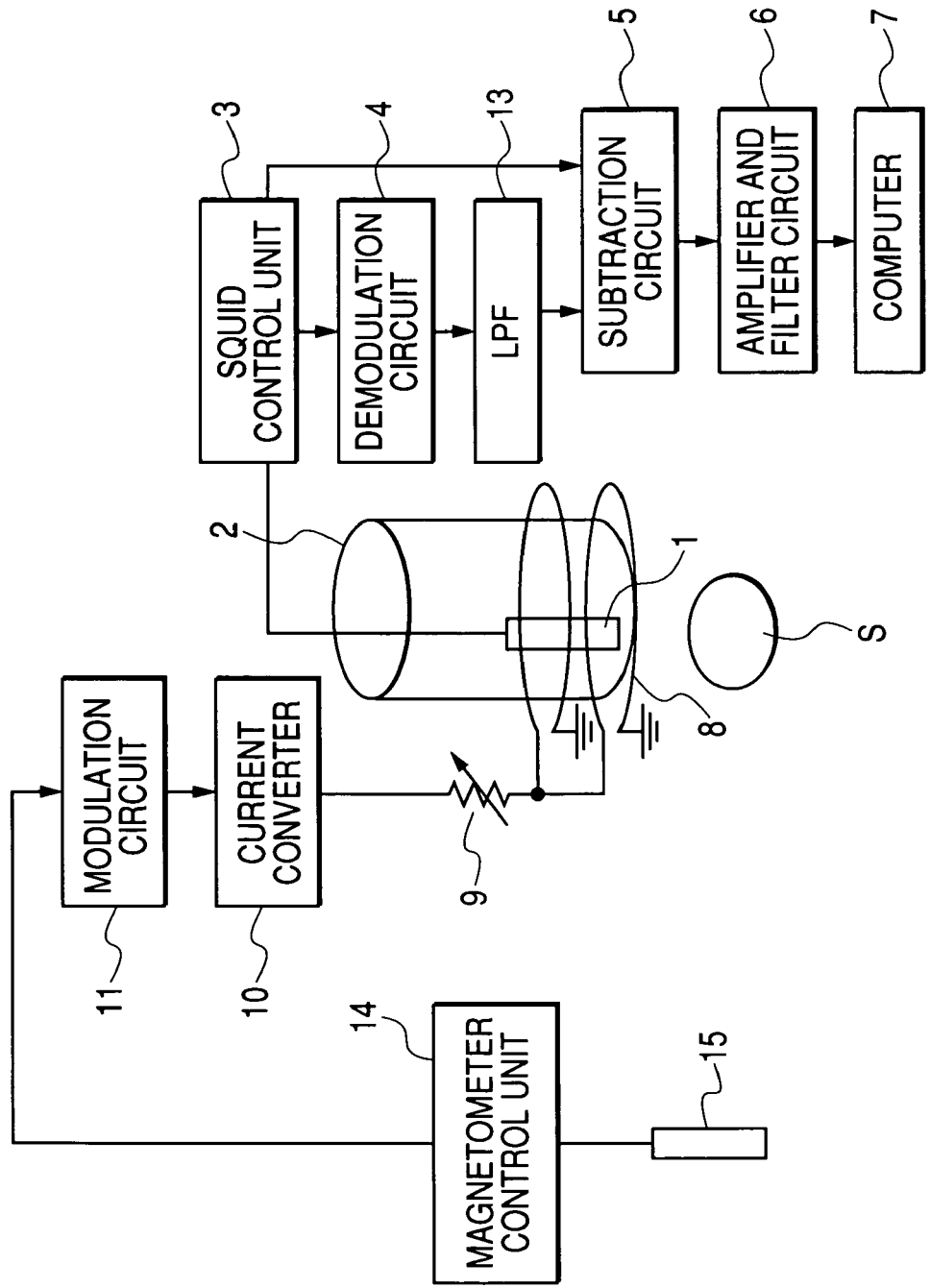
FIG. 1 is a diagram showing a structural example of the magnetic field measurement apparatus according to the first embodiment of the present invention.

FIG. 1 is a diagram showing a structural example of the magnetic field measurement apparatus according to the first embodiment of the present invention. FIG. 1 shows a simplest system configuration where a magnetically shielded room is not used. Since the interference magnetic noise is large in the structure of FIG. 1, it is desirable to use a second-order (or a first-order) gradiometer as a pick-up coil. The interference magnetic noise is picked up due to a variation in canceling rates derived from an error in creating the gradiometer type pick-up coil 1. In this situation, since a solenoid coil 8 generates a uniform field, it is possible to pick up the interference magnetic noises respectively corresponding to the individual canceling rates with respect to each of the individual pick-up coils 1. Since the interference magnetic noise peculiar to each of the pick-up coils can be picked up, it is possible to reduce the interference magnetic field with a high degree of accuracy.

EXAMPLE 2

Figure 2:
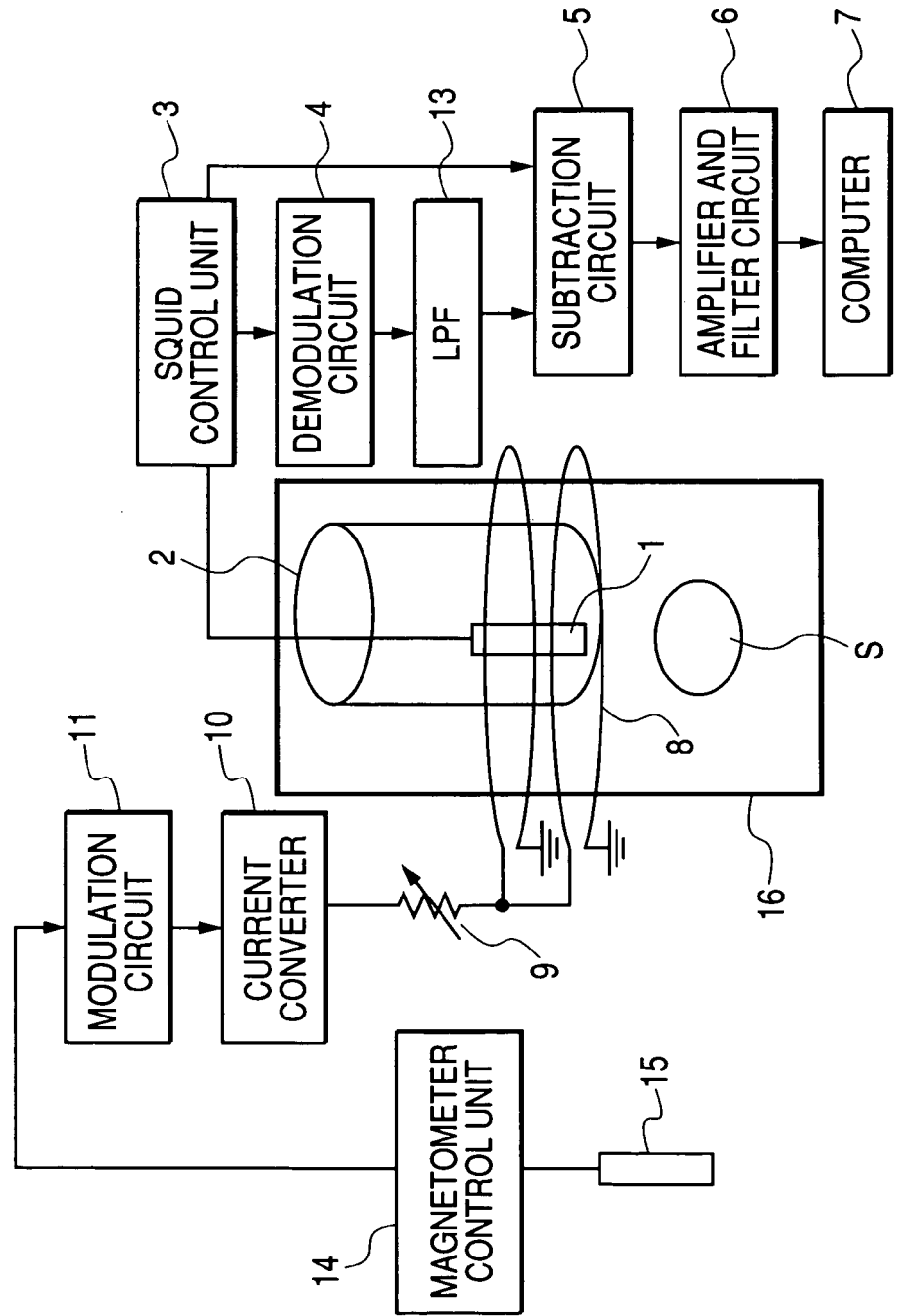
FIG. 2 is a diagram showing a structural example of the magnetic field measurement apparatus according to the second embodiment of the present invention.

FIG. 2 is a diagram showing a structural example of the magnetic field measurement apparatus according to the second embodiment of the present invention. In the second embodiment, the magnetically shielded room 16 is attached to the first embodiment. In the structure as shown in FIG. 2, the cryostat 2 and the examination object S are positioned within the magnetically shielded room 16, and the solenoid coil 8 is arranged in such a manner as going along the outside surface of the magnetically shielded room 16. In the structure of FIG. 2, since the interference magnetic noise is relatively small, it is possible to use as the pick-up coil 1, a pick-up coil having a lower degree, such as a first-order type or a magnet meter. It is matter of course to use a second-order gradiometer as the pick-up coil, in an adverse environment with regard to the interference magnetic noise.

Figure 9:
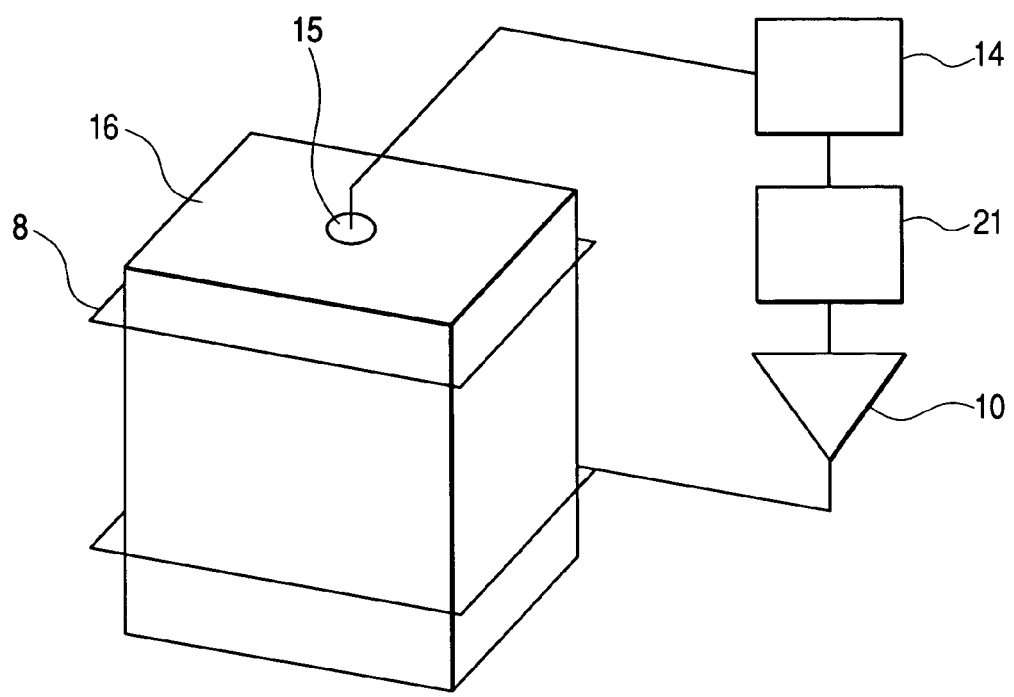
FIG. 9 is a diagram for explaining a conventional art.

Within the magnetically shielded room 16, there exists a shielding factor distortion spatially. Therefore, the interference magnetic field coming to be mixed from the outside the magnetically shielded room 16 is also subjected to distortion. As shown in FIG. 9, it is general to place the solenoid coil outside the magnetically shielded room also in the conventional art. The embodiment as shown in FIG. 2 is configured such that the modulation circuit 11 and the demodulation circuit 4 are added to the structure of the prior art shown in FIG. 9. With the structure as thus described, the present invention has a feature to reduce the interference magnetic field element with a high degree of accuracy, which has not been fully reduced in the prior art of FIG. 9.

Furthermore, since the magnetic field for reducing the interference magnetic field, having a spatial distortion property of the magnetically shielded room 16, is generated by the solenoid coil 8, it is also possible to reduce a distorted wave element peculiar to the magnetically shielded room. In the structure of FIG. 2, in addition to the cancel of the interference magnetic noise of around 20 dB by the feedback magnetic field from the solenoid coil 8 in the conventional art, it is expected to reduce the interference magnetic noise of 10 to 20 dB more, by canceling the interference magnetic field by the modulation circuit and the demodulation circuit.

EXAMPLE 3

Figure 3:
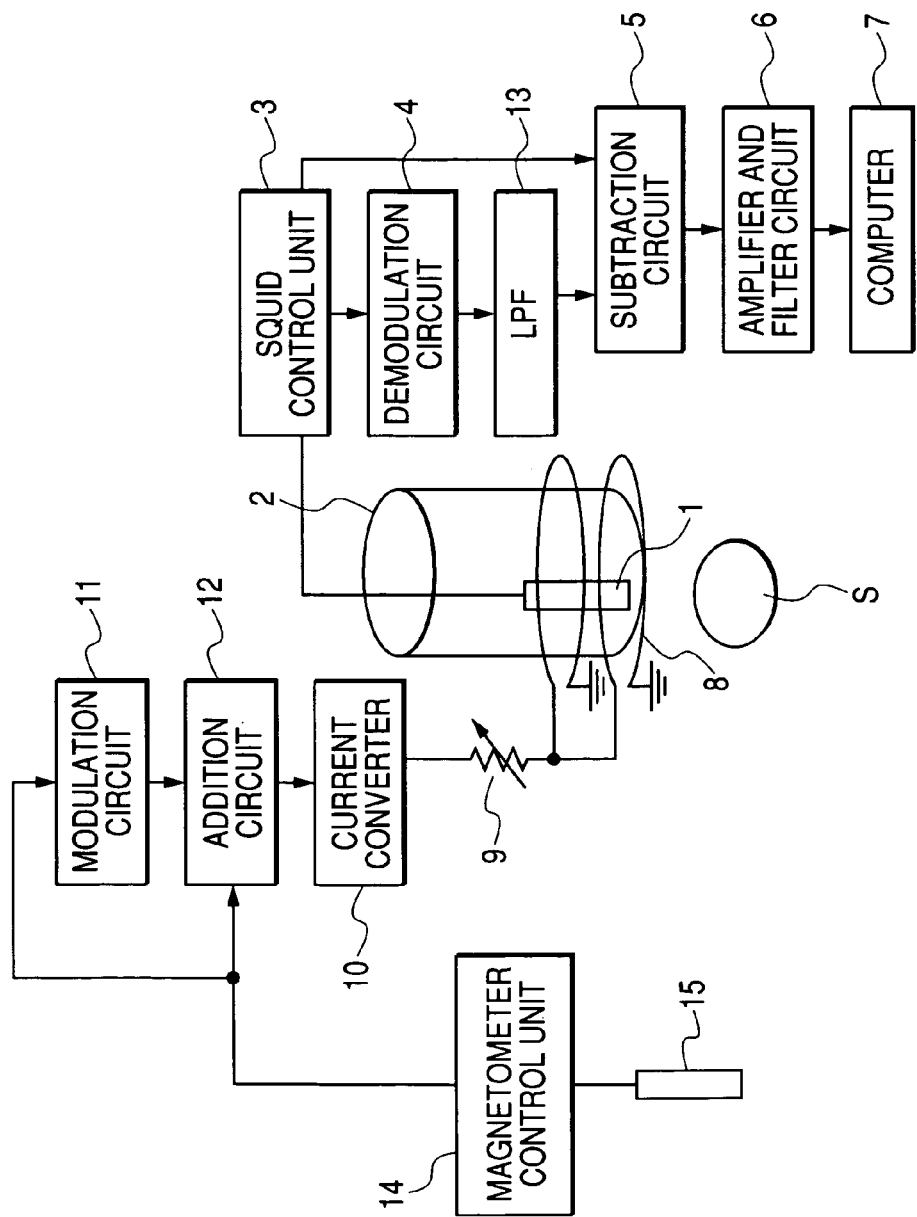
FIG. 3 is a diagram showing a structural example of the magnetic field measurement apparatus according to the third embodiment of the present invention.

FIG. 3 is a diagram showing a structural example of the magnetic field measurement apparatus according to the third embodiment of the present invention. In the structure of the third embodiment, the addition circuit 12 is attached to the first embodiment. As shown in FIG. 3, the third embodiment is configured such that a signal of the magnetic field itself picked up by the magnetometer sensor unit 15 is allowed to flow into the solenoid coil 8 as a current. The magnetic field generated in the solenoid coil 8 is rendered in the inverse direction of the magnetic field direction picked up by the magnetometer sensor unit 15, and the variable resistor 9 is adjusted so that the output of the interference magnetic noise from the SQUID control unit 3 is minimized.

With the configuration as described above, the present invention has a feature that a large interference magnetic signal picked up by the magnetometer sensor unit 15 is reduced, and simultaneously interference magnetic noises peculiar to respective pick-up coils can be picked up, whereby it is possible to reduce the interference magnetic noises with a high degree of accuracy.

EXAMPLE 4

Figure 4:
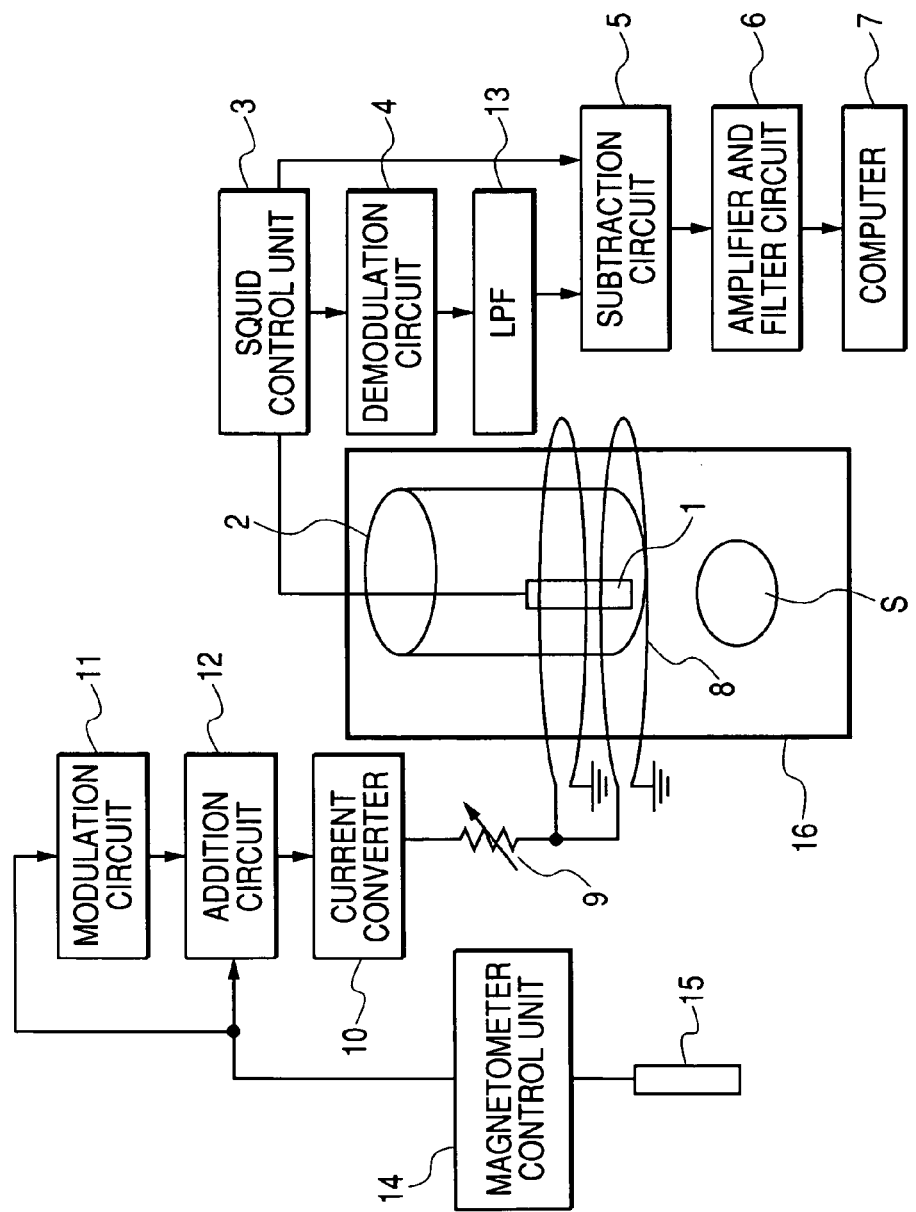
FIG. 4 is a diagram showing a structural example of the magnetic field measurement apparatus according to the fourth embodiment of the present invention.

FIG. 4 is a diagram showing a structural example of the magnetic field measurement apparatus according to the fourth embodiment of the present invention. In the structure of the fourth embodiment, the magnetically shielded room 16 is attached to the third embodiment. As shown in FIG. 4, the magnetically shielded room 16 is placed between the solenoid coil 8 and the pick-up coil 1. In the structure of FIG. 4, since the interference magnetic noise is relatively small, it is possible to use as the pick-up coil 1, a pick-up coil having a lower degree, such as a first-order type or a magnet meter. It is matter of course to use a second-order gradiometer as the pick-up coil, in an adverse environment with regard to the interference magnetic noise.

Also in the fourth embodiment, similar to the case of the third embodiment, the magnetic field generated in the solenoid coil 8 is rendered in the inverse direction of the magnetic field direction picked up by the magnetometer sensor unit 15, and the variable resistor 9 is adjusted so that the output of the interference magnetic noise from the SQUID control unit 3 is minimized.

With the configuration as described above, the present invention has a feature to reduce a large interference magnetic signal picked up by the magnetometer sensor unit 15, simultaneously to reduce the interference magnetic field element with a high degree of accuracy, which has not been fully reduced in the prior art of FIG. 9. Furthermore, since the magnetic field for reducing the interference magnetic field, having a spatial distortion property of the magnetically shielded room 16, is generated by the solenoid coil 8, it is also possible to reduce a distorted wave element peculiar to the magnetically shielded room.

EXAMPLE 5

Figure 5:
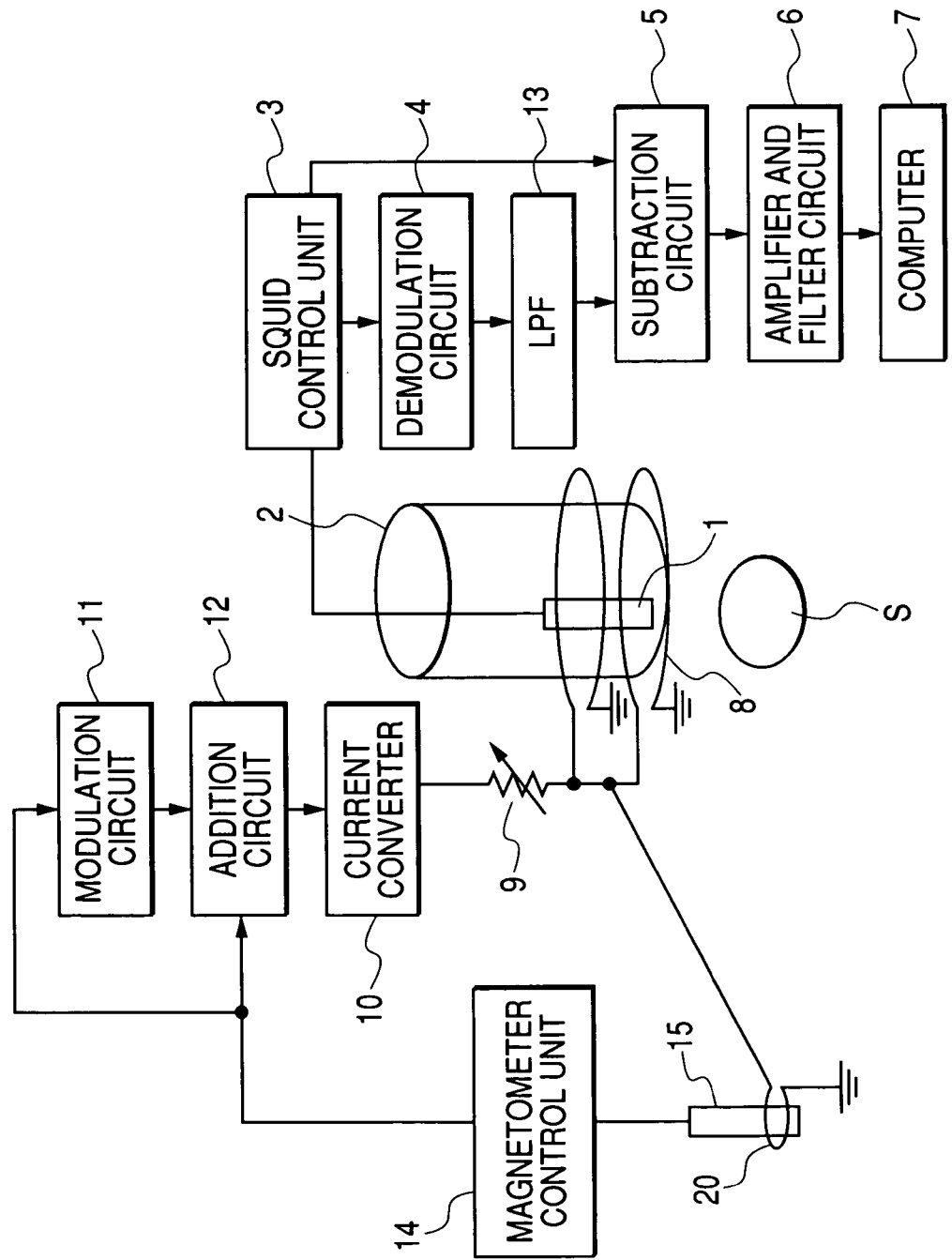
FIG. 5 is a diagram showing a structural example of the magnetic field measurement apparatus according to the fifth embodiment of the present invention.

FIG. 5 is a diagram showing a structural example of the magnetic field measurement apparatus according to the fifth embodiment of the present invention. In the fifth embodiment, a feedback coil 20 is attached to the third embodiment. FIG. 5 shows a structure that the feedback coil 20 is mounted on the magnetometer sensor unit 15 so that the magnetic field itself picked up by the magnetometer sensor unit 15 is also given a feedback.

The feedback coil 20 is configured in such a manner that the coil diameter and number of turns are adjusted to equalize the magnetic field generated by the feedback coil 20 and the magnetic field generated by the solenoid coil 8. As for the feedback coil 20, the current amount is adjusted by the variable resistor 9, allowing the current to flow so that the magnetic field inputted to the magnetometer sensor unit 15 is canceled.

EXAMPLE 6

FIG. 6 is a diagram showing a structural example of the magnetic field measurement apparatus according to the sixth embodiment of the present invention. In the sixth embodiment, the magnetometer sensor unit 15 is positioned inside the solenoid coil 8 in the structure of the third embodiment. As shown in FIG. 6, it is configured such that the magnetometer sensor unit 15 is positioned inside the solenoid coil 8 so that a feedback is given to the magnetic field itself, which is picked up by the magnetometer sensor unit 15. As for the adjustment of current amount to the solenoid coil 8, the variable resistor 9 is adjusted so that the output from the magnetometer control unit 14 is minimized.

In all the figures for explaining the first embodiment (FIG. 1) to the sixth embodiment (FIG. 6), the solenoid coil 8 is assumed to be a uniaxial coil. However, as the solenoid coil 8, a coil directing to three magnetic field directions of three axes (x, y, and z) respectively, may be employed. Furthermore, it is needless to say that a reduction of the interference magnetic field with a higher degree of accuracy is possible, by implementing circuits independently corresponding to the three axes respectively, where carrier frequencies being different by the three axes are used in the modulation circuit 11 and the demodulation circuit 4.

According to the present invention, it is possible to reduce, with a high degree of accuracy, the interference magnetic field due to a difference in canceling rate of the pick-up coil, without using the magnetically shielded room.

Further in an environment where only a simple magnetically shielded room is used, a magnetic field measurement apparatus can be implemented, which is capable of measuring the magnetic field generated from an examination object, with a high degree of accuracy. Therefore, the present invention is quite advantageous in the field of weak magnetic field measurement, such as biomagnetic field measurement, for example, magnetocardiogram and magnetoencephalogram, geomagnetic measurement, nondestructive inspection and the like.

What is claimed is:

1. A magnetic field measurement apparatus comprising:
    a first magnetometer having a pick-up coil for picking up a magnetic field generated from an examination object;
    a first control unit for controlling the first magnetometer;
    a second magnetometer for picking up an interference magnetic field;
    a second control unit for controlling the second magnetometer;
    a modulation circuit for modulating an output from the second control unit;
    a current converter for converting the output from the modulation circuit to a current amount;
    a current amount adjusting means for adjusting the current amount thus converted;
    a coil which is positioned outside the pick-up coil of the first magnetometer and through which the current thus adjusted by the current amount adjusting means flows;
    a demodulation circuit which demodulates the output from the first control unit with the same frequency as that of the modulation circuit;
    a low-pass filter for extracting a low frequency element of the output voltage from the demodulation circuit; and
    a subtraction circuit for subtracting an output of the low-pass filter from the output of the first control unit.

2. A magnetic field measurement apparatus according to claim 1, wherein,
    the first magnetometer comprises a superconducting quantum interference device (SQUID) magnetometer, and includes a cryostat for cooling the first magnetometer.

3. A magnetic field measurement apparatus according to claim 1, wherein a pick-up section of the second magnetometer is positioned outside the coil through which the current adjusted by the current amount adjusting means flows.

4. A magnetic field measurement apparatus according to claim 3, wherein,
    an amplifier and filter circuit is provided in order to obtain an output signal within a desired frequency band from an output of the subtraction circuit, and a signal processing is performed based on an output signal from the amplifier and filter circuit.

5. A magnetic field measurement apparatus according to claim 3, comprising a magnetically shielded room for carrying out a magnetic shielding by surrounding the first magnetometer and the examination object, wherein, the coil through which the current adjusted by the current amount adjusting means flows is positioned outside the magnetically shielded room.

6. A magnetic field measurement apparatus according to claim 5, wherein,
    an amplifier and filter circuit is provided in order to obtain an output signal within a desired frequency band from an output of the subtraction circuit, and a signal processing is performed based on an output signal from the amplifier and filter circuit.

7. A magnetic field measurement apparatus comprising:
- a first magnetometer having a pick-up coil for picking up a magnetic field generated from an examination object;
- a first control unit for controlling the first magnetometer;
- a second magnetometer for picking up an interference magnetic field;
- a second control unit for controlling the second magnetometer;
- a modulation circuit for modulating an output from the second control unit;
- an addition circuit for adding an output from the second control unit to an output from the modulation circuit;
- a current converter for converting an output from the addition circuit to a current amount;
- a current amount adjusting means for adjusting the current amount thus converted;
- a coil which is positioned outside the pick-up coil of the first magnetometer and through which the current thus adjusted by the current amount adjusting means flows;
- a demodulation circuit which demodulates the output from the first control unit with the same frequency as that of the modulation circuit;
- a low-pass filter for extracting a low frequency element of the output voltage from the demodulation circuit; and
- a subtraction circuit for subtracting an output of the low-pass filter from the output of the first control unit.

8. A magnetic field measurement apparatus according to claim 7, wherein,
- the first magnetometer comprises a superconducting quantum interference device (SQUID) magnetometer, and includes a cryostat for cooling the first magnetometer.

9. A magnetic field measurement apparatus according to claim 7, wherein a pick-up section of the second magnetometer is positioned outside the coil through which the current adjusted by the current amount adjusting means flows.

10. A magnetic field measurement apparatus according to claim 9, wherein,
- an amplifier and filter circuit is provided in order to obtain an output signal within a desired frequency band from an output of the subtraction circuit, and a signal processing is performed based on an output signal from the amplifier and filter circuit.

11. A magnetic field measurement apparatus according to claim 9, comprising a magnetically shielded room for carrying out a magnetic shielding by surrounding the first magnetometer and the examination object, wherein, the coil through which the current adjusted by the current amount adjusting means flows is positioned outside the magnetically shielded room.

12. A magnetic field measurement apparatus according to claim 11, wherein,
- an amplifier and filter circuit is provided in order to obtain an output signal within a desired frequency band from an output of the subtraction circuit, and a signal processing is performed based on an output signal from the amplifier and filter circuit.

13. A magnetic field measurement apparatus according to claim 7, further comprising a feedback coil through which the current adjusted by the current amount adjusting means flows, the feedback coil being positioned outside the second magnetometer.

14. A magnetic field measurement apparatus according to claim 13, wherein a pick-up section of the second magnetometer is positioned outside a coil through which the current adjusted by the current amount adjusting means flows.

15. A magnetic field measurement apparatus according to claim 14, wherein an amplifier and filter circuit is provided in order to obtain an output signal within a desired frequency band from an output of the subtraction circuit, and a signal processing is performed based on an output signal from the amplifier and filter circuit.

16. A magnetic field measurement apparatus according to claim 7, the pick-up section of the second magnetometer is positioned inside a coil through which the current adjusted by the current amount adjusting means flows.

17. A magnetic field measurement apparatus according to claim 16, wherein an amplifier and filter circuit is provided in order to obtain an output signal within a desired frequency band from an output of the subtraction circuit, and a signal processing is performed based on an output signal from the amplifier and filter circuit.

18. A magnetic field measurement apparatus comprising:
- a superconducting quantum interference device (SQUID) magnetometer having a pick-up coil for picking up a magnetic field generated from an examination object;
- a cryostat for cooling the SQUID magnetometer;
- a first control unit for controlling the SQUID magnetometer;
- a magnetometer for picking up an interference magnetic field;
- a second control unit for controlling the magnetometer;
- a modulation circuit for modulating an output from the second control unit;
- a current converter for converting the output from the modulation circuit to a current amount;
- a current amount adjusting means for adjusting the current amount thus converted;
- a coil which is positioned outside the cryostat and arranged in such a manner as surrounding the pick-up coil of the SQUID magnetometer and through which the current thus adjusted by the current amount adjusting means flows;
- a demodulation circuit which demodulates the output from the first control unit with the same frequency as that of the modulation circuit;
- a low-pass filter for extracting a low frequency element of the output voltage from the demodulation circuit; and
- a subtraction circuit for subtracting an output of the low-pass filter from the output of the first control unit.

19. A magnetic field measurement apparatus comprising:
- a superconducting quantum interference device (SQUID) magnetometer having a pick-up coil for picking up a magnetic field generated from an examination object;
- a cryostat for cooling the SQUID magnetometer;
- a first control unit for controlling the SQUID magnetometer;
- a magnetometer for picking up an interference magnetic field;
- a second control unit for controlling the magnetometer;
- a modulation circuit for modulating an output from the second control unit;
- an addition circuit for adding the output from the second control unit to the output from the modulation circuit;
- a current converter for converting the output from the addition circuit to a current amount;
- a current amount adjusting means for adjusting the current amount thus converted;
- a coil which is positioned outside the cryostat and arranged in such a manner as surrounding the pick-up coil of the SQUID magnetometer and through which the current thus adjusted by the current amount adjusting means flows;

a demodulation circuit which demodulates the output from the first control unit with the same frequency as that of the modulation circuit;

a low-pass filter for extracting a low frequency element of the output voltage from the demodulation circuit; and a subtraction circuit for subtracting an output of the low-pass filter from the output of the first control unit.

* * * * *